United States Patent
Shin

(10) Patent No.: US 11,488,642 B2
(45) Date of Patent: Nov. 1, 2022

(54) MEMORY DEVICE AND CONTROL METHOD THEREOF

(71) Applicant: SAMSUNG ELECTRONICS CO., LTD., Suwon-si (KR)

(72) Inventor: Hoyoung Shin, Gunpo-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/376,401

(22) Filed: Jul. 15, 2021

(65) Prior Publication Data

US 2022/0084563 A1 Mar. 17, 2022

(30) Foreign Application Priority Data

Sep. 15, 2020 (KR) .................. 10-2020-0118171

(51) Int. Cl.
*G11C 16/06* (2006.01)
*G11C 7/06* (2006.01)
*G11C 7/12* (2006.01)
*G11C 7/02* (2006.01)
*G11C 7/04* (2006.01)

(52) U.S. Cl.
CPC .................. *G11C 7/06* (2013.01); *G11C 7/02* (2013.01); *G11C 7/04* (2013.01); *G11C 7/12* (2013.01)

(58) Field of Classification Search
CPC .... G11C 7/06; G11C 7/02; G11C 7/04; G11C 7/12
USPC ..................................... 365/185.21
See application file for complete search history.

(56) References Cited

U.S. PATENT DOCUMENTS

| 7,589,580 | B2 | 9/2009 | Lee et al. |
| 8,503,220 | B2 | 8/2013 | Kim et al. |
| 8,509,008 | B2 | 8/2013 | Lee |
| 9,401,680 | B2 | 7/2016 | Park et al. |
| 9,928,917 | B2 | 3/2018 | Shin et al. |
| 10,001,416 | B2 | 6/2018 | Cho et al. |
| 2020/0011742 | A1 | 1/2020 | Ma et al. |
| 2021/0243860 | A1* | 8/2021 | Chisaka ................. H05B 45/18 |

FOREIGN PATENT DOCUMENTS

JP 5970993 8/2016

* cited by examiner

*Primary Examiner* — Huan Hoang
(74) *Attorney, Agent, or Firm* — F. Chau & Associates, LLC

(57) ABSTRACT

Disclosed is a memory device, which includes a memory cell, a bit line connected to the memory cell, a controller that generates at least one current control code, a first current generator that generates a first current having a proportional to absolute temperature (PTAT) characteristic, based on the at least one current control code from the controller, a second current generator that generates a second current having a complementary to absolute temperature (CTAT) characteristic, based on the at least one current control code from the controller, a subtractor that generates a third current by subtracting the second current from the first current, and a sense amplifier that controls a load current to be supplied to the bit line based on the third current, and generates a bit line compensation current for compensating for a leakage current of the bit line.

20 Claims, 11 Drawing Sheets

MEMORY DEVICE AND CONTROL METHOD THEREOF

CROSS-REFERENCE TO RELATED APPLICATION

This application claims priority under 35 U.S.C. § 119 to Korean Patent Application No. 10-2020-0118171 filed on Sep. 15, 2020, in the Korean Intellectual Property Office, the disclosure of which is incorporated by reference herein in its entirety.

TECHNICAL FIELD

Embodiments described herein relate generally to a semiconductor memory device and a control method thereof, and more particularly to a method for compensating for a leakage current of a bit line according to temperature.

DISCUSSION OF RELATED ART

A conventional semiconductor memory device has been designed to compensate for bit line leakage current using a compensation circuit that outputs a "proportional to absolute temperature" (PTAT) current to a sense amplifier coupled to the bit line. However, because a slope of a PTAT current may be determined by a characteristic of a PTAT core, it may be difficult to compensate for bit line leakage current that exponentially increases as a function of temperature.

SUMMARY

Embodiments of the inventive concept provide a method for compensating for a proportional to absolute temperature (PTAT) current supplied to a sense amplifier of a memory device, and efficiently compensating for bit line leakage current based on the compensated PTAT current.

According to an exemplary embodiment, a memory device includes a memory cell, a bit line connected to the memory cell, a controller that generates at least one current control code, a first current generator that generates a first current having a proportional to absolute temperature (PTAT) characteristic, based on the at least one current control code from the controller, a second current generator that generates a second current having a complementary to absolute temperature (CTAT) characteristic, based on the current control code from the controller, a subtractor configured to generate a third current by subtracting the second current from the first current, and a sense amplifier configured to control, based on the third current, a load current to be supplied to the bit line, and generate a bit line compensation current for compensating for a leakage current of the bit line.

The memory device may further include a pulse signal generator that outputs a pre-charge pulse signal to the sense amplifier, and the pulse signal generator may generate the pre-charge pulse signal based on a magnitude of the third current under control of the controller.

When a temperature increases, the controller may output the current control code allowing the magnitude of the third current to increases and a pulse width of the pre-charge pulse signal to increase.

The controller may generate the current control code such that the second current is generated based on an increment of the first current.

When a temperature decreases, the controller may output the current control code allowing the magnitude of the third current to decreases and a pulse width of the pre-charge pulse signal to decrease.

The controller may generate the current control code such that the second current is generated based on a decrement of the first current.

The controller may output the current control code to control a slope of the third current depending on a temperature of the memory device.

The second current generator may perform a current mirror operation.

The memory cell may include one of a dynamic random access memory (DRAM) cell, a static random access memory (SRAM) cell, and a NAND flash memory cell.

According to an exemplary embodiment, a control method of a memory device includes generating at least one current control code, and controlling the memory device by using the at least one current control code. The controlling of the memory device includes generating a first current having a proportional to absolute temperature (PTAT) characteristic based on the at least one current control code, generating a second current having a complementary to absolute temperature (CTAT) characteristic based on the at least one current control code, generating a third current by subtracting the second current from the first current, controlling a load current to be supplied to a bit line based on the third current, and generating a bit line compensation current for compensating for a leakage current of the bit line.

The method may further include generating a pre-charge pulse signal to be provided to a sense amplifier, and the controlling of the memory device may further include controlling the pulse signal generator generating the pre-charge pulse signal based on a magnitude of the third current.

The controlling of the memory device may further include outputting the current control code allowing the magnitude of the third current to increases and a pulse width of the pre-charge pulse signal to increase, when a temperature increases.

The controlling of the memory device may further include generating the current control code such that the second current is generated based on an increment of the first current.

The controlling of the memory device may further include outputting the current control code allowing the magnitude of the third current to decreases and a pulse width of the pre-charge pulse signal to decrease, when a temperature decreases.

The controlling of the memory device may further include generating the current control code such that the second current is generated based on a decrement of the first current.

The controlling of the memory device may further include outputting the current control code for controlling a slope of the third current depending on a temperature of the memory device.

The second current may be generated by a current mirror operation.

The controlling of the memory device may further include controlling one of a dynamic random access memory (DRAM) cell, a static random access memory (SRAM) cell, and a NAND flash memory cell.

According to an exemplary embodiment, a control circuit of a memory device includes a controller, a first current generator that generates a first current having a proportional to absolute temperature (PTAT) characteristic, a second current generator that generates a second current having a complementary to absolute temperature (CTAT) characteristic, and a pre-charge pulse signal generator that outputs a pre-charge pulse signal to a current sense amplifier circuit, and the controller outputs at least one control code for controlling a magnitude of the first current, a magnitude of the second current, and a width of the pre-charge pulse signal.

The control circuit may control the magnitude of the first current, the magnitude of the second current, and the width of the pre-charge pulse signal based on a change of a temperature of the memory device.

In another aspect, a memory device includes: a memory cell; a bit line connected to the memory cell; a first current generator configured to generate a first current having a proportional to absolute temperature (PTAT) characteristic; a second current generator configured to generate a second current having a complementary to absolute temperature (CTAT) characteristic; a subtractor configured to generate a third current by subtracting the second current from the first current; and a sense amplifier configured to control, based on the third current, a load current to be supplied to the bit line, and generate a bit line compensation current for compensating for a leakage current of the bit line.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
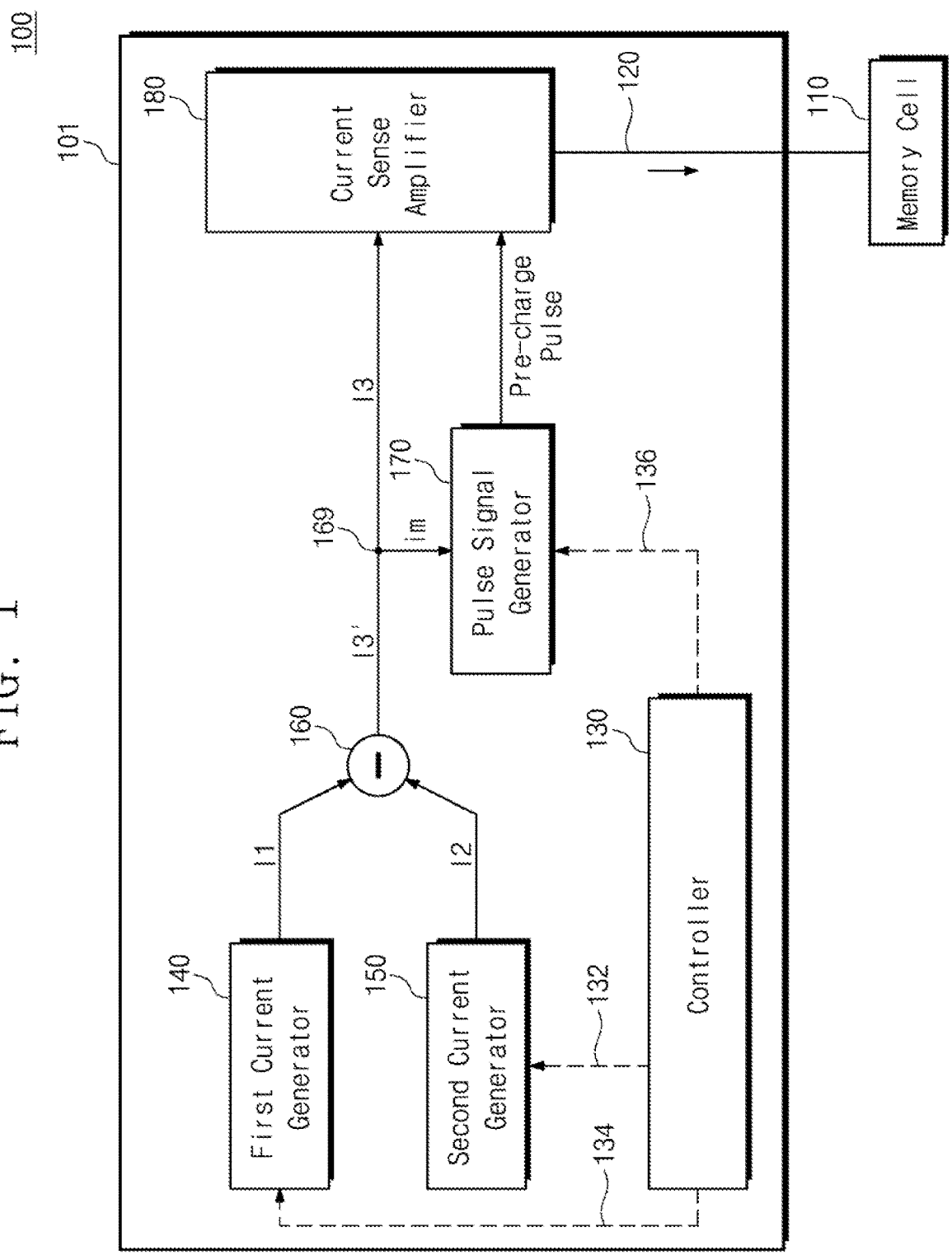
FIG. 1 is a block diagram illustrating an example memory device according to the inventive concept.

Hereinafter, principles of operation and embodiments of the inventive concept will be described with reference to the accompanying drawings. In the following description, like reference characters denote like elements or features, but descriptions of conventional elements may be omitted. Elements denoted as "parts", "modules", "members", and "blocks" may be implemented with hardware or processing circuitry/logic circuitry executing software. In some embodiments, a plurality of parts, modules, members, or blocks are implemented with a single element, or one part, module, member, or block may include a plurality of elements.

Throughout this detailed description, when a part is referred to as being "connected" to another part, it may be "directly connected" or "indirectly connected," through an intervening element and/or "connected through a wireless communication network."

In addition, when a part "includes" an element, another element may be further included, rather than excluding the existence of another element, unless otherwise described.

Terms "first", "second", and the like are used herein to distinguish one element from another element, and the elements are not limited to the terms described above.

As used herein, singular forms "a" and "an" are intended to include plural forms as well, unless the context clearly indicates otherwise.

Reference characters in operations are used for the sake of convenience of description and do not necessitate an order of the operations. Such operations may be performed through an order different from the described order unless the context clearly indicates a specific order.

Herein, for brevity, when an element or signal is first described with a name and a legend, the element or signal may be subsequently referred to with just the name or with just the legend. For example, a "first current $I_1$" may later be referred to as just "$I_1$", or just "the first current". Similarly, a "first code Code 1" may later be referred to as just "Code 1" or "the first code".

Herein, the phrases "with temperature" or "according to temperature" mean "as a function of increasing temperature". For example, a current that is described as "increasing with temperature" is a current that increases as temperature increases.

Figure 2:
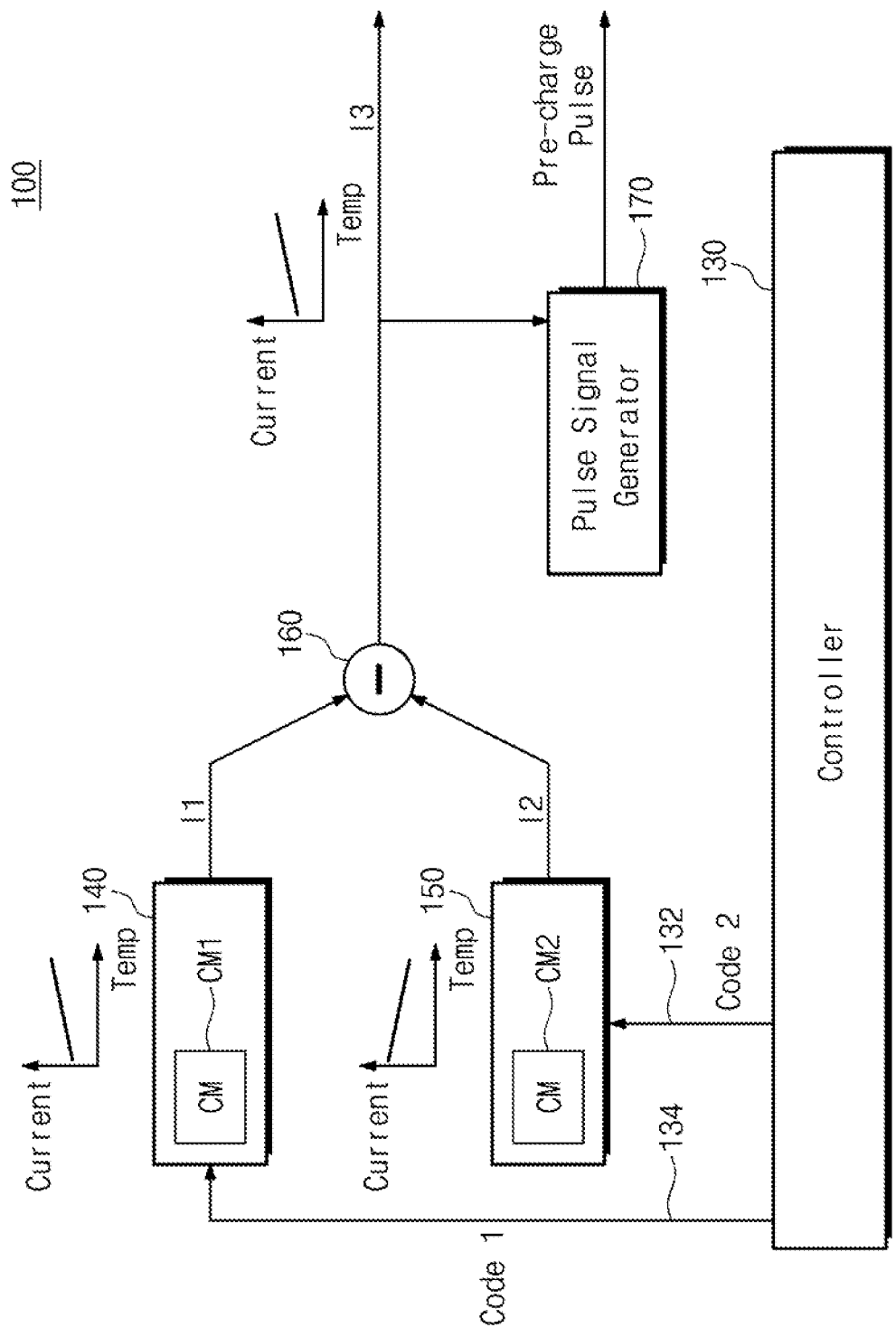
FIG. 2 is a diagram illustrating example signals and general current vs. temperature graphs of currents flowing within the memory device of FIG. 1.

FIG. 1 is a block diagram of an example memory device 100 according to the inventive concept, and FIG. 2 illustrates example signals and general current vs. temperature graphs of currents flowing within the memory device 100. Referring to FIGS. 1 and 2, the memory device 100 may include a control circuit 101 and a memory cell 110. The control circuit 101 may include a bit line 120, a controller 130, a first current generator 140, a second current generator 150, a calculator 160, a pulse signal generator 170, and a current sense amplifier 180.

The first current generator 140 may generate a first current $I_1$ having a proportional to absolute temperature (PTAT) characteristic (or a "PTAT current characteristic"). The second current generator 150 may generate a second current $I_2$ having a complementary to absolute temperature (CTAT) characteristic (or a "CTAT current characteristic"). The calculator 160 may perform a calculation on the first and second currents $I_1$ and $I_2$. The pulse signal generator 170 may generate a pre-charge pulse signal.

The memory cell 110 is an information storage element that may be implemented with one of a dynamic random access memory (DRAM) cell, a static random access memory (SRAM) cell, and a NAND flash memory cell.

During a read operation of the memory device 100, the bit line 120 may be pre-charged and may then be developed depending on whether the memory cell 110 is an on-cell or an off-cell. A NAND flash memory cell may be divided into an on-cell and an off-cell depending on a program. The memory cell after completion of the program is on-cell, and the memory cell before completion of the program is off-cell. An on-cell may have a different threshold voltage than on off-cell.

The controller 130 may control the first current generator 140, the second current generator 150, and the pulse signal generator 170. The controller 130 may provide a first control signal to the first current generator 140, and the first current generator 140 may generate a first current I1 based on the first control signal. The controller 130 may provide a second control signal to the second current generator 150, and the second current generator 150 may generate a second current I2 based on the second control signal. The controller 130 may provide a third control signal to the pulse signal generator 170, and the pulse signal generator 170 may generate a pre-charge pulse signal based on the third control signal. Depending on the embodiment, the first control signal, the second control signal, and the third control signal may be code control signals, and discussion proceeds assuming that they are code control signals. However, the first control signal, the second control signal, and the third control signal are not limited to the code control signal, and may be, for example, a current control signal or a voltage control signal.

The controller 130 may generate at least one current control code, which may include a first code "Code 1" for generating the first current I1 and a second code "Code 2" for generating the second current I2. The at least one current control code may be determined according to temperature of the memory device 100. For example, when the temperature of the memory device 100 changes, the at least one current control code may be changed.

Code 1 may be input to the first current generator 140 via a control path 134, and Code 2 may be input to the second current generator 150 via a control path 132. Code 1 may determine a magnitude of the first current I1, and Code 2 may determine a magnitude of the second current I2. Code 1 and Code 2 may be determined based on a temperature of the memory device 100. Also, as will be described later, a width of the pre-charge pulse signal may be adjusted based on a magnitude of a third current I3, which is determined based on Code 1 and Code 2. The controller 130 may provide control signals to the pulse signal generator 170 via a control path 136.

The first current generator 140 may generate the first current, which is proportional to absolute temperature (PTAT), based on the Code 1. The magnitude of the first current is proportional to temperature. As temperature of the memory device 100 increases, the magnitude of the first current increases with a positive value (or with a positive temperature coefficient). That is, the first current shows a temperature tendency of increasing with a positive slope as a function of temperature (as temperature increases).

The second current generator 150 generates the second current, which is complementary to absolute temperature (CTAT), based on the second code Code 2. The magnitude of the second current is inversely proportional to temperature of the memory device. As a temperature of the memory device 100 increases, the magnitude of the second current decreases. That is, the second current shows a temperature tendency of decreasing with a negative slope depending on a decrease of a temperature. Here, the second current may be a CTAT or a zero current transformer (ZTC) current.

As depicted in FIG. 2, the first current generator 140 may include a first current mirror CM1 that receives the first code Code 1 from the controller 130 via the control path 134, and the second current generator 150 may include a second current mirror CM2 that receives the second code Code 2 via the control path 132. For example, Code 1 may be an n-bit code and Code 2 may be an m-bit code, where n and m are each one or more. N may equal m in some examples, and may differ from m in other examples. There may be n and m control lines in paths 134 and 132, respectively, leading to the respective current mirrors CM1 and CM2. Current mirror CM1 may include n lower FETs and n upper FETs. Current mirror CM2 may include m lower FETs and m upper FETs. Each of the n lower FETs of CM1 may receive, at a gate terminal thereof, one bit of the n-bit code of Code 1. Each of the m lower FETs of CM2 may receive, at a gate terminal thereof, one bit of the m-bit code of Code 2. The current mirrors CM1 and CM2 are connected to suitable circuit points of the first current generator 140 and the second current generator 150, respectively.

Figure 3:
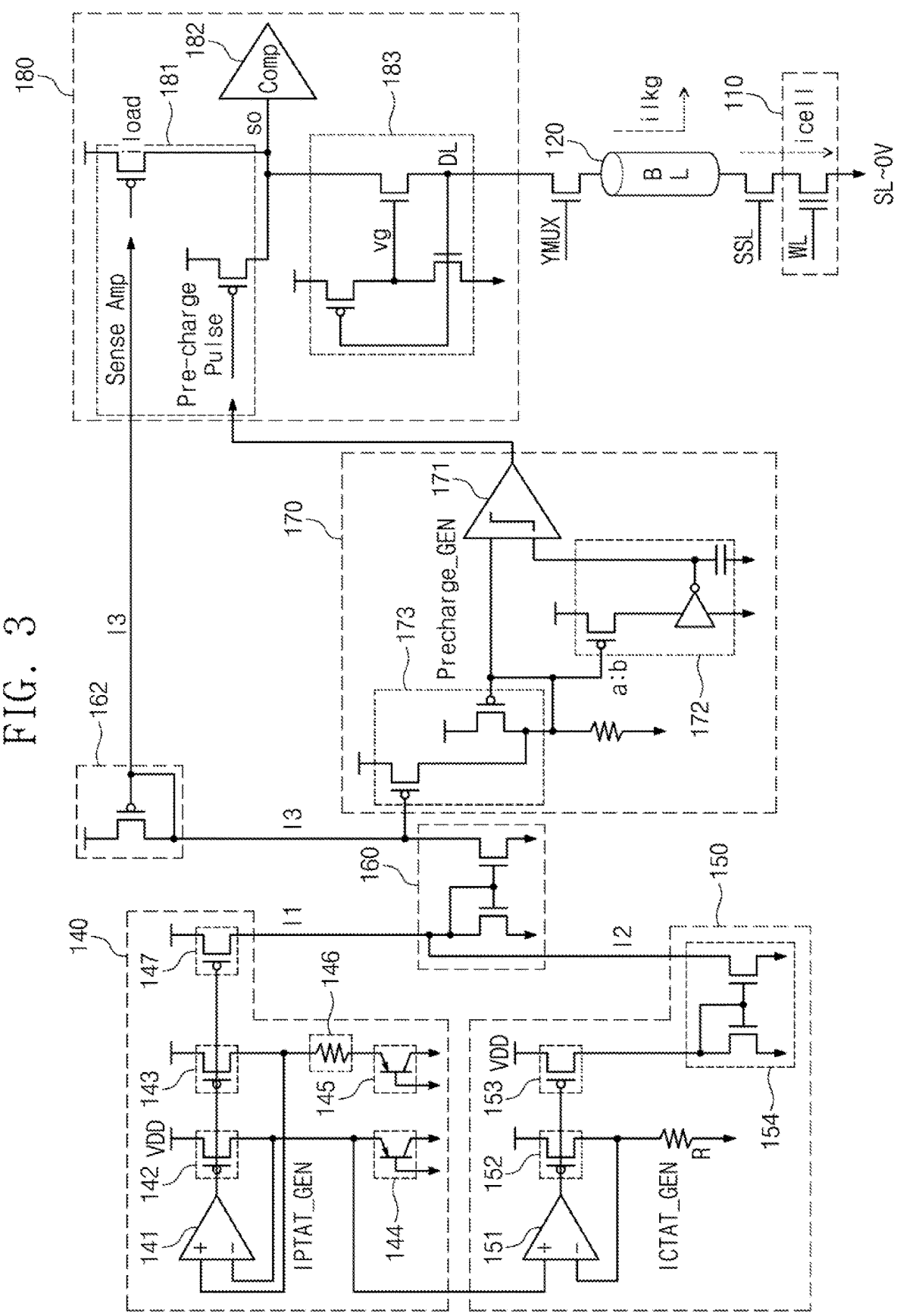
FIG. 3 is a circuit diagram illustrating a memory device according to an embodiment of the inventive concept.

In other examples, such as that shown in FIG. 3, at least one of the current mirrors CM1 and CM2 may be omitted, and at least one of Code 1 and Code 2 may be applied directly to at least one of the first and second current generators 140 and 150, respectively.

The calculator 160 performs calculation on the first current and the second current. For example, the calculator 160 is a subtractor that subtracts the second current I2 from the first current I1 to generate the third current I3. Note that the third current I3 may have approximately the same magnitude as a current I3' directly flowing from the output of calculator 160. This is because the current I3' is split at a node 169 into a current im that flows to the pulse signal generator 170 and the current I3. Since the current im may be much smaller than I3' (e.g., at least one order of magnitude smaller), I3≈I3', and in the following discussion for ease of description the third current I3 may be referred to as either the current directly output from the calculator 160 or the current applied to the sense amplifier 180.

Hereafter, "temperature" refers to the temperature on a surface of the memory device 100, or in an environment surrounding the memory device 100.

Through the subtraction operation, the calculator 160 may supplement an increase of the first current according to temperature by generating the third current. In the case where a temperature increases, the magnitude of the first current increases, and the magnitude of the second current decreases. In this case, a current that is obtained by subtracting the second current from the first current increases with temperature. In general, as temperature increases, it may be possible to reduce the amount of current that is leaked out from the bit line 120. In a conventional device, a magnitude of current that is leaked out from the bit line 120 increases with temperature. However, as temperature increases, a magnitude of the third current of the inventive concept may become greater, and the memory device 100 according to the inventive concept may reduce the amount of current leaked out from the bit line 120, though use of the third current. A process in which the memory device 100 according to the inventive concept reduces leakage current of the bit line 120 will be more fully described with reference to FIGS. 8 and 9.

The pulse signal generator 170 according to the inventive concept receives the current im, which is based on the current I3', and generates the pre-charge pulse signal based on a magnitude of the third current I3. (As noted above, because im is small or negligible, I3' may be assumed to be about the same magnitude as I3; therefore, the current im may be said to be based on the current I3.) When temperature of the memory device 100 increases, the pulse signal generator 170 generates the pre-charge pulse signal of a large width based on a magnitude of the third current. However, when temperature of the memory device 100 decreases, the pulse signal generator 170 generates the pre-charge pulse signal of a small width based on a magnitude of the third current.

The current sense amplifier 180 according to the inventive concept receives the third current and the pre-charge pulse signal. As described above, by compensating for the first current by using the second current, the third current may exacerbate a current vs. temperature characteristic of the first current having the PTAT characteristic (resulting in an increased slope of the third current $I_3$ vs. temperature). As a result, as a compensation current that is input to the current sense amplifier 180 increases and a width of the pre-charge pulse signal is adjusted, the memory device 100 according to the inventive concept may effectively reduce leakage current that occurs at the bit line 120.

In other embodiments, the first current generator 140 and the second current generator 150 are configured to generate the first current I1 and the second current I2, respectively, with the slope characteristics described above, even without receiving the codes Code 1 and Code 2 from the controller 130. In these embodiments, the control paths 132, 134 and 136 may be omitted.

FIG. 3 illustrates a circuit diagram of the memory device 100 according to an embodiment of the inventive concept.

Referring to FIG. 3, the first current generator 140 includes an operational amplifier 141, a first PMOS transistor 142, a second PMOS transistor 143, a third PMOS transistor 147, a first junction transistor 144, a second junction transistor 145, and a resistor 146. A power supply voltage VDD may be applied to the first PMOS transistor 142 and the second PMOS transistor 143.

The operational amplifier 141 amplifies an input voltage signal to generate the first current. A voltage difference of the input voltage signal occurs due to the resistor 146, and the amplifier 141 may amplify the voltage difference and output the amplified voltage to the gates of each of the PMOS transistors 142, 143, and 147. Each of the PMOS transistors 142, 143, and 147 may be turned on or off based on the amplified voltage. When the third PMOS transistor 147 is turned on based on the amplified voltage, the first current generator 140 may output the first current I1. In this case, the third PMOS transistor 147 may control the magnitude of the first current I1 based on the first control signal from the controller 130. The junction transistors 144 and 145 may perform a role of buffering and transferring the first current to the second current generator 150. In detail, as the junction transistors 144 and 145 buffer the first current, which increases depending on an increase of a temperature, so as to be transferred to the second current generator 150, the second current generator 150 may stably output the second current.

The second current generator 150 receives the first current and the second control signal and generates the second current I2 that is complementary to absolute temperature (CTAT). The second current generator 150 includes an operational amplifier 151, a fourth PMOS transistor 152, a fifth PMOS transistor 153, and an equivalent resistor "R". The operational amplifier 151 amplifies the voltage difference between the emitter voltage of the junction transistor 144 and the drain voltage of the fourth PMOS transistor 152, and output the amplified voltage to the gates of each of the PMOS transistors 152 and 153. Each of the PMOS transistors 152 and 153 may be turned on or off based on the amplified voltage. When the fifth PMOS transistor 153 is turned on based on the amplified voltage, the fifth PMOS transistor 153 may output the second current I2 to the current mirror circuit 154. The current mirror circuit 154 may perform a current mirroring operation, and the second current generator 150 may output a second current I2 based on the current mirroring operation. According to an embodiment, the second current generator 150 may generate a zero current transformer (ZTC) current based on the second control signal without using the emitter voltage of the first current generator 140.

The current mirror circuit 154 may control the magnitude of the second current I2 based on the second control signal received from the controller 130. The current mirror circuit 154 mirrors the second current I2 from the second current generator 150 such that the second current I2 is transferred to the calculator 160. The calculator 160 receives the first current I1 and the second current I2 and generates the third current I3 corresponding to a current obtained by subtracting the second current I2 from the first current I1. The third current I3 thus generated is input to the current sense amplifier 180.

The memory device 100 may further include a current input circuitry 162. the current input circuitry 162 may be included in the calculator 160, but are not limited thereto. For example, the current input circuitry 162 may be included in the current sense amplifier 180.

The pulse signal generator 170 receives the third current through a unit (circuitry) 173 that receives the third current input. When the third current is received, the pulse signal generator 170 provides the third current to a pulse signal generating circuit 172. The third current is input to the pulse signal generating circuit 172 through a buffering operation based on a given reference, and the pulse signal generating circuit 172 generates a pulse signal (or a pre-charge pulse signal). Here, the given reference is variable depending on a magnitude of the third current and is affected by a temperature. Also, the pulse signal generating circuit 172 adjusts the amount of current that is output through the buffering operation and adjusts a width of the pulse signal. When the pulse signal is generated, an amplifier 171 amplifies and outputs the pulse signal to the current sense amplifier 180.

The current sense amplifier 180 may include a signal input unit (circuitry) 181, a comparator 182, and a compensation current output unit (circuitry) 183. The signal input unit 181 receives the third current and the pre-charge pulse signal. The signal input unit 181 may output the bit line compensation current based on the third current in a high period of the pre-charge pulse signal. Specifically, the pre-charge pulse signal is input to the signal input unit 181 in a low period of the pre-charge pulse signal and is maintained in the high period of the pre-charge pulse signal. However, a level of the pre-charge pulse signal may be lowered due to a bit line leakage current. The signal input unit 181 may output the bit line compensation current according to the third current to compensate for the lowered level. The comparator 182 may read the level of the sensing node so based on the pre-charge pulse signal and the third current. For example, the level of the sensing node so may be 1 or 0, and the comparator 182 may output 1 or 0 data. The compensation current output unit 183 outputs a compensation current of the bit line leakage current.

Figure 4:
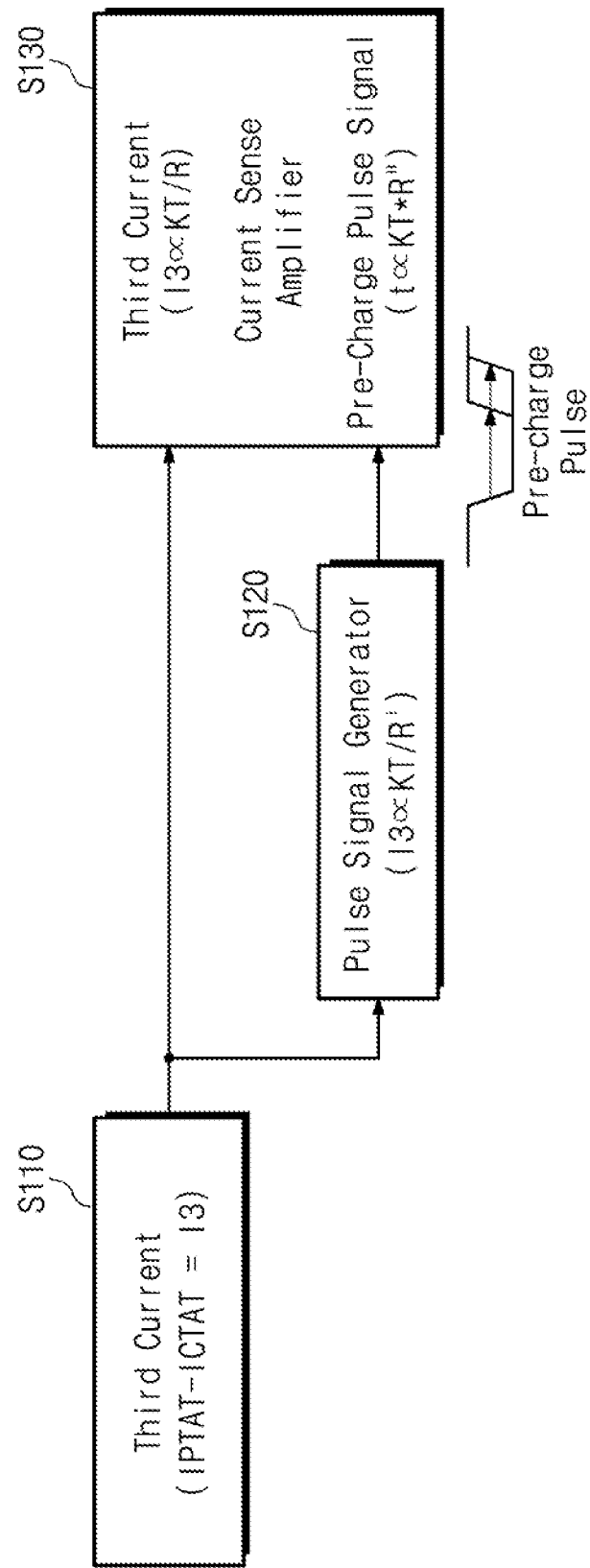
FIG. 4 is a conceptual diagram illustrating a method for compensating for a bit line leakage current.

FIG. 4 is a conceptual diagram illustrating a method in which the memory device 100 of the inventive concept compensates for bit line leakage current. For convenience, the description will be given with reference to FIGS. 1 to 3 collectively.

The first current generator 140 and the second current generator 150 according to the inventive concept respectively generate the first current and the second current, and the calculator 160 according to the inventive concept generates the third current by subtracting the second current from the first current (S110). Referring to FIG. 4, the third current is proportional to a temperature. The third current thus generated is input to the pulse signal generator 170 and the current sense amplifier 180.

The pulse signal generator 170 receives the third current and generates the pre-charge pulse signal to be input to the current sense amplifier 180 based on a magnitude of the third current (S120). Referring to FIG. 4, a width of the pre-charge pulse signal that the pulse signal generator 170 generates is proportional to a temperature. That is, as a temperature of the memory device 100 increases, a width of the pre-charge pulse signal becomes greater; as a temperature of the memory device 100 decreases, a width of the pre-charge pulse signal becomes smaller. According to the above description, in the case where a temperature of the memory device 100 increases, the current sense amplifier 180 receives the third current of a great magnitude and the pre-charge pulse signal of a great width and efficiently compensates for a leakage current of the bit line 120 (S130). Also, a read speed of the memory device 100 according to the inventive concept may be improved by efficiently compensating for the leakage current of the bit line 120.

Figure 5:
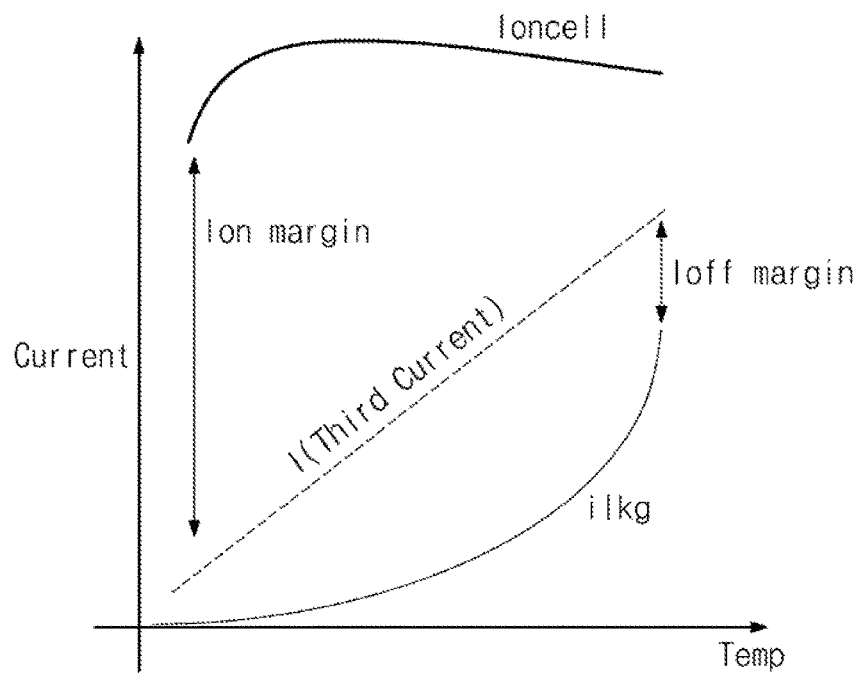
FIG. 5 is a diagram illustrating a temperature tendency of a bit line leakage current, a load current, and a third current according to the inventive concept.

FIG. 5 illustrates a temperature tendency of a bit line leakage current, a load current, and the third current according to the inventive concept. Here, the third current is expressed by I3. In a graph disclosed in FIG. 5, an X-axis represents a temperature, and a Y-axis represents a current.

Referring to FIG. 5, an on-cell current Ioncell, the intensity of which increases depending on an increase of a temperature in a given period and is then maintained at a given level, is input to the memory cell 110. Here, a difference between the third current and the on-cell current Ioncell is defined as an on-cell margin Ion margin. Also, a bit line leakage current ilkg exponentially increases depending on an increase of a temperature. Here, a difference between the third current and the leakage current ilkg is defined as an off-cell margin Ioff margin. As understood from FIG. 5, the memory device 100 according to the inventive concept may compensate for a slope of the third current by compensating for the first current having the PTAT characteristic by using the second current having the CTAT characteristic. As a result, a magnitude of the on-cell margin Ion margin decreases, and a magnitude of the off-cell margin Ioff margin increases. As the magnitude of the on-cell margin Ion margin decreases and the magnitude of the off-cell margin Ioff margin increases, the memory device 100 may quickly compensate for a bit line leakage current stably against a temperature change, and thus, a read speed of the memory cell 110 is improved.

Figure 6:
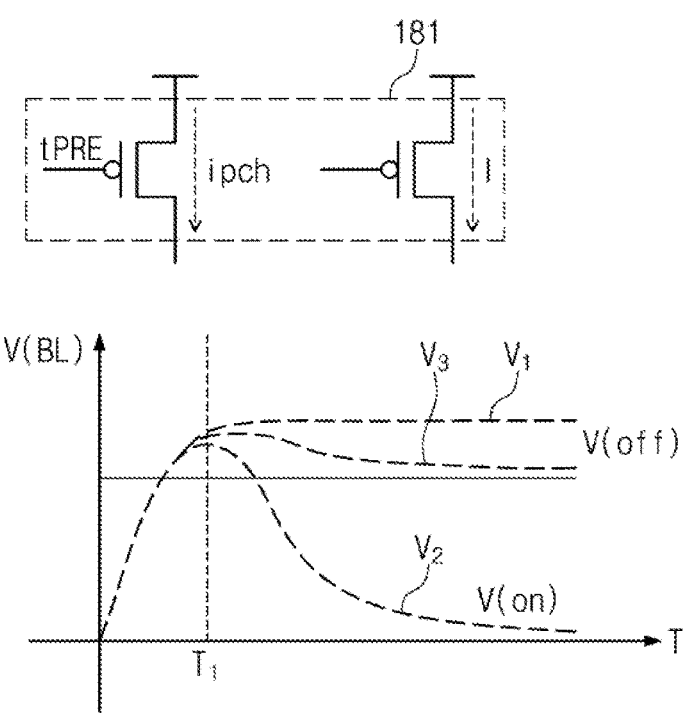
FIG. 6 is a diagram illustrating a tendency of a third current and a pre-charge pulse signal according to the inventive concept.

FIG. 6 illustrates a tendency of the third current and the pre-charge pulse signal according to the inventive concept. In a graph disclosed in FIG. 6, an X-axis represents a temperature, and a Y-axis represents a voltage applied to the bit line 120. In FIG. 6, "tPRE" and I3 are signals input to the signal input unit 181 of the current sense amplifier 180. In detail, "tPRE" is a signal of controlling a width of the pre-charge pulse signal, "ipch" is the pre-charge pulse signal, and I3 is the third current. Also, "$V_1$" is an off cell voltage, "$V_2$" is an on-cell voltage, and "$V_3$" is a voltage corresponding to a compensation current.

Referring to FIG. 6, in the case where a temperature increases to a threshold temperature $T_1$, because a current leaked out from the bit line 120 increases, a compensation current need to be increased, and a pre-charge time need to be further secured for the off-cell timing stability of the memory cell 110. Accordingly, the memory device 100 may generate the third current (=IPTAT−ICTAT) to compensate for a bit line leakage current occurring at a high temperature and a pre-charge time. Also, at a low temperature, it may be possible to improve a temperature-dependent characteristic by reducing the third current I3 and the pre-charge time that are unnecessary for improving an on-cell speed of the memory cell 110.

Figure 7:
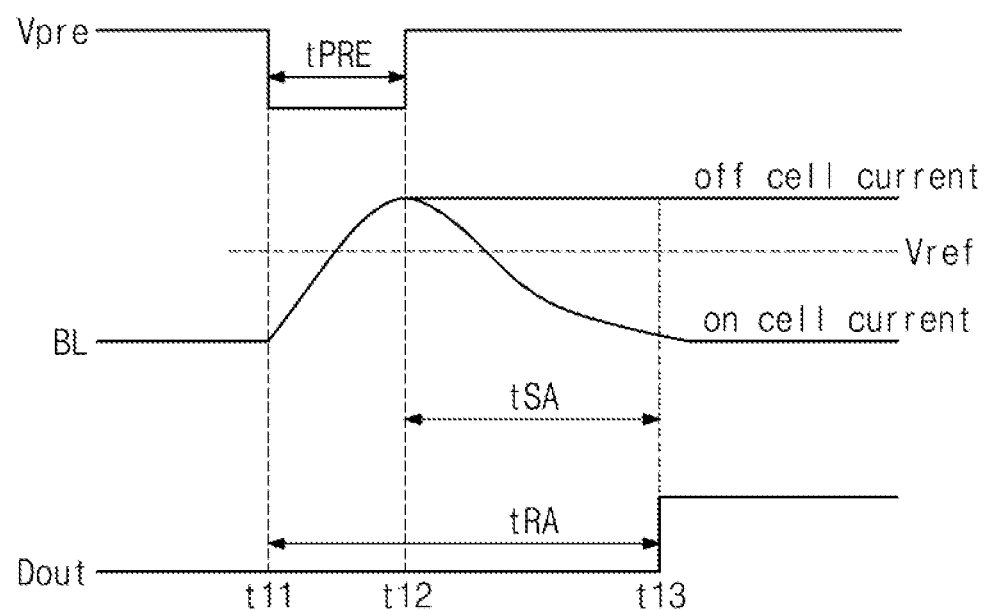
FIG. 7 is a timing diagram for describing an operating principle of a pulse signal generator according to the inventive concept.

FIG. 7 is a timing diagram for describing an operating principle of the pulse signal generator 170 according to the inventive concept.

Referring to FIG. 7, when a leakage current is detected from the bit line 120, the signal tPRE of controlling a width of the pre-charge pulse signal is received, and the pre-charge pulse signal is generated. As such, the current sense amplifier 180 may compensate for a bit line leakage current during a time tSA and may supply a uniform current to the memory cell 110 in an on-cell state. In FIG. 7, "tRA" is a time from when the signal tPRE of controlling a width of the pre-charge pulse signal is received to when a bit line leakage current is compensated for.

Accordingly, because a level of an input voltage increases as a temperature of the memory device 100 increases, a pulse width of a pre-charge control signal Vpre increases; because the level of the input voltage decreases as the temperature of the memory device 100 decreases, the pulse width of the pre-charge control signal Vpre decreases.

Figure 8:
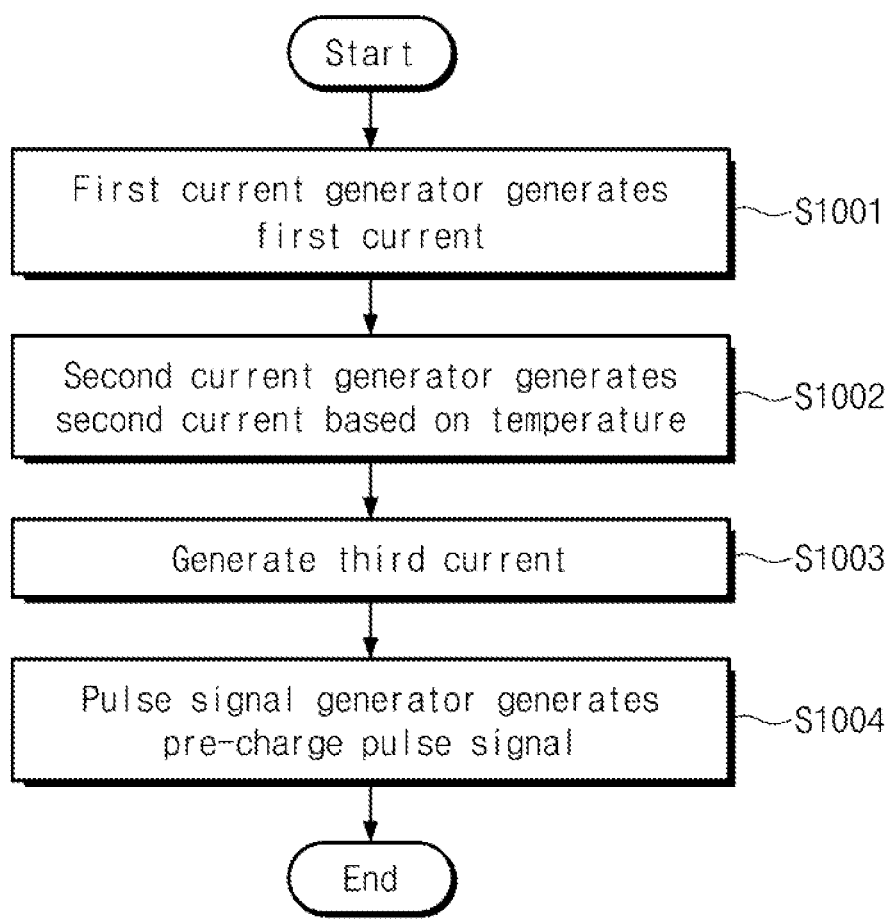
FIG. 8 is a flowchart illustrating a control method of a memory device according to the inventive concept.

FIG. 8 is a flowchart illustrating a control method of the memory device 100 according to the inventive concept.

Referring to FIG. 8, the first current generator 140 generates the first current (S1001). Here, the first current has a PTAT characteristic. Accordingly, the first current is proportional to a temperature.

When the first current is generated, the second current generator 150 generates the second current based on a temperature of the memory device 100 (S1002). Here, the second current has a CTAT characteristic for compensating for the first current. Also, the first current and the second current are respectively generated based on the first code Code 1 and the second code Code 2 that are determined depending on a temperature of the memory device 100.

When the second current is generated, the memory device 100 subtracts the second current from the first current to generate the third current (S1003). Here, the third current is a current for compensating for a current leaked out from the bit line 120.

When the third current is generated, the pulse signal generator 170 generates the pre-charge pulse signal based on the third current (S1004). The pre-charge pulse signal is generated such that a width of the pre-charge pulse signal becomes greater as temperature increases and becomes smaller as temperature decreases.

Through the process of FIG. 8, the memory device 100 according to the inventive concept may generate a uniform bit line compensation current even in a change of a temperature and may generate the pre-charge pulse signal according to a temperature. Accordingly, a read speed of the memory device 100 may be improved.

Figure 9:
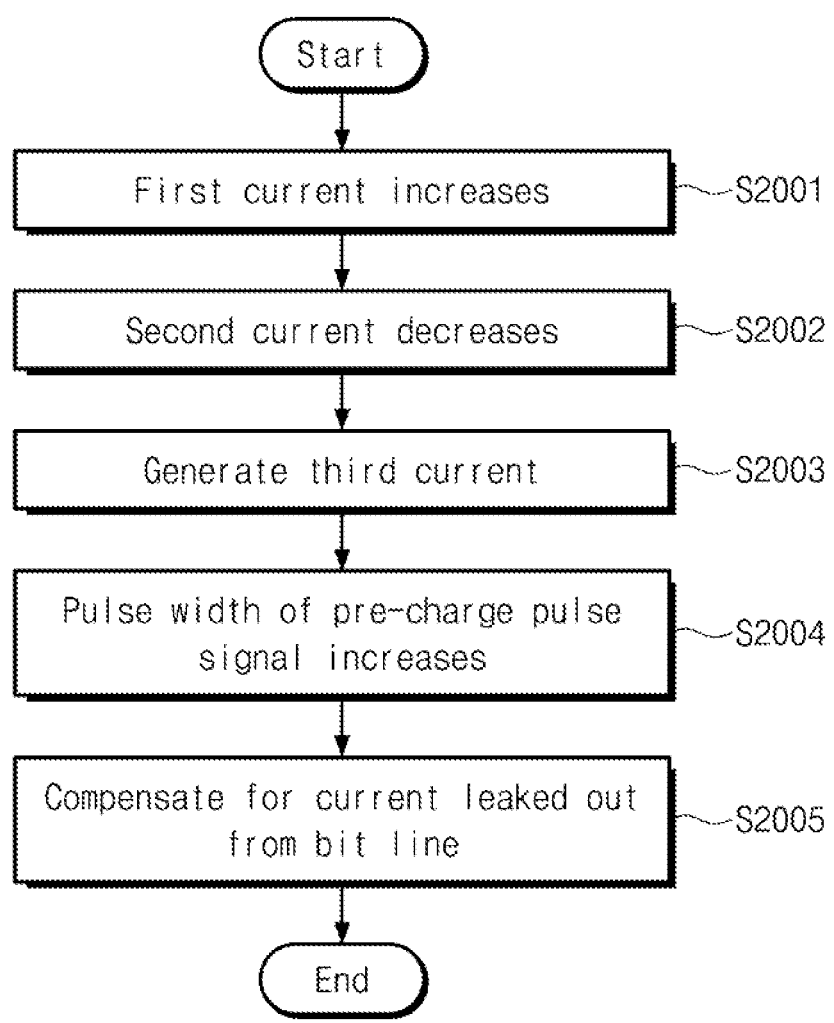
FIG. 9 is a flowchart illustrating a control method of a memory device according to the inventive concept, when a temperature increases.

FIG. 9 is a flowchart illustrating a control method of the memory device 100 according to the inventive concept, when temperature increases. As shown in FIG. 9, as temperature increases, a magnitude of the first current having the PTAT characteristic increases in proportion to the temperature (S2001).

As the first current increases, a magnitude of the second current having the CTAT characteristic decreases in inverse proportion to the temperature (S2002).

When the first current and the second current are generated, the memory device 100 subtracts the second current from the first current to generate the third current (S2003). Here, because the first current has a positive temperature coefficient and the second current has a negative temperature coefficient, as a temperature increases, a positive temperature correlation of the third current becomes greater. Thus, the third current has an amplified PTAT characteristic. As such, when a temperature of the memory device 100 increases, an incremental change of the third current is greater than an incremental change of the first current.

When the third current is generated, the pulse signal generator 170 generates the pre-charge pulse signal. Here, as temperature increases, a pulse width of the pre-charge pulse signal increases (S2004).

When the pre-charge pulse signal of an increased pulse width is generated, the current sense amplifier 180 compensates for current leaked out from the bit line 120 based on the third current (S2005). As described above, in the case where temperature increases, a magnitude of the third current may increase, and a width of the pre-charge pulse signal increases. Accordingly, the current sense amplifier 180 may efficiently compensate for an increasing bit line leakage current.

Figure 10:
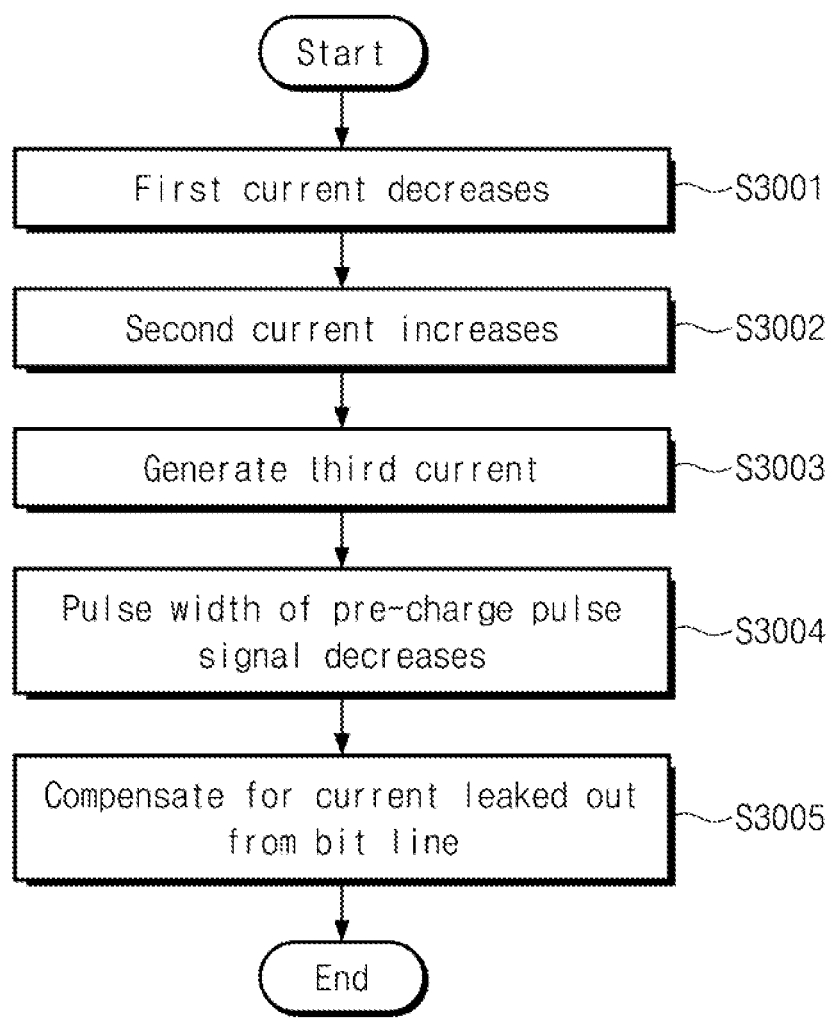
FIG. 10 is a flowchart illustrating a control method of a memory device according to the inventive concept, when a temperature decreases.

FIG. 10 is a flowchart illustrating a control method of the memory device 100 according to the inventive concept, when temperature decreases. As temperature decreases, a magnitude of the first current having the PTAT characteristic decreases in proportion to the temperature (S3001).

As the first current decreases, a magnitude of the second current having the CTAT characteristic increases (S3002).

When the first current and the second current are generated, the memory device 100 subtracts the second current from the first current to generate the third current (S3003). Here, because the first current has a negative slope and the second current has a positive slope, when temperature decreases, the reduction in the third current is exacerbated as compared to the first current. That is, the third current has an amplified PTAT characteristic. As such, when a temperature of the memory device 100 decreases, a decremental change of the third current is greater than a decremental change of the first current.

When the third current is generated, the pulse signal generator 170 generates the pre-charge pulse signal. Here, as temperature decreases, a pulse width of the pre-charge pulse signal decreases (S3004).

When the pre-charge pulse signal of a decreased pulse width is generated, the current sense amplifier 180 compensates for current leaked out from the bit line 120 based on the third current and the pre-charge pulse signal (S3005). As described above, in the case where temperature decreases, the third current may decrease but remain above a given magnitude, and a width of the pre-charge pulse signal may decrease. Accordingly, the current sense amplifier 180 may efficiently compensate for an increasing bit line leakage current.

Figure 11:
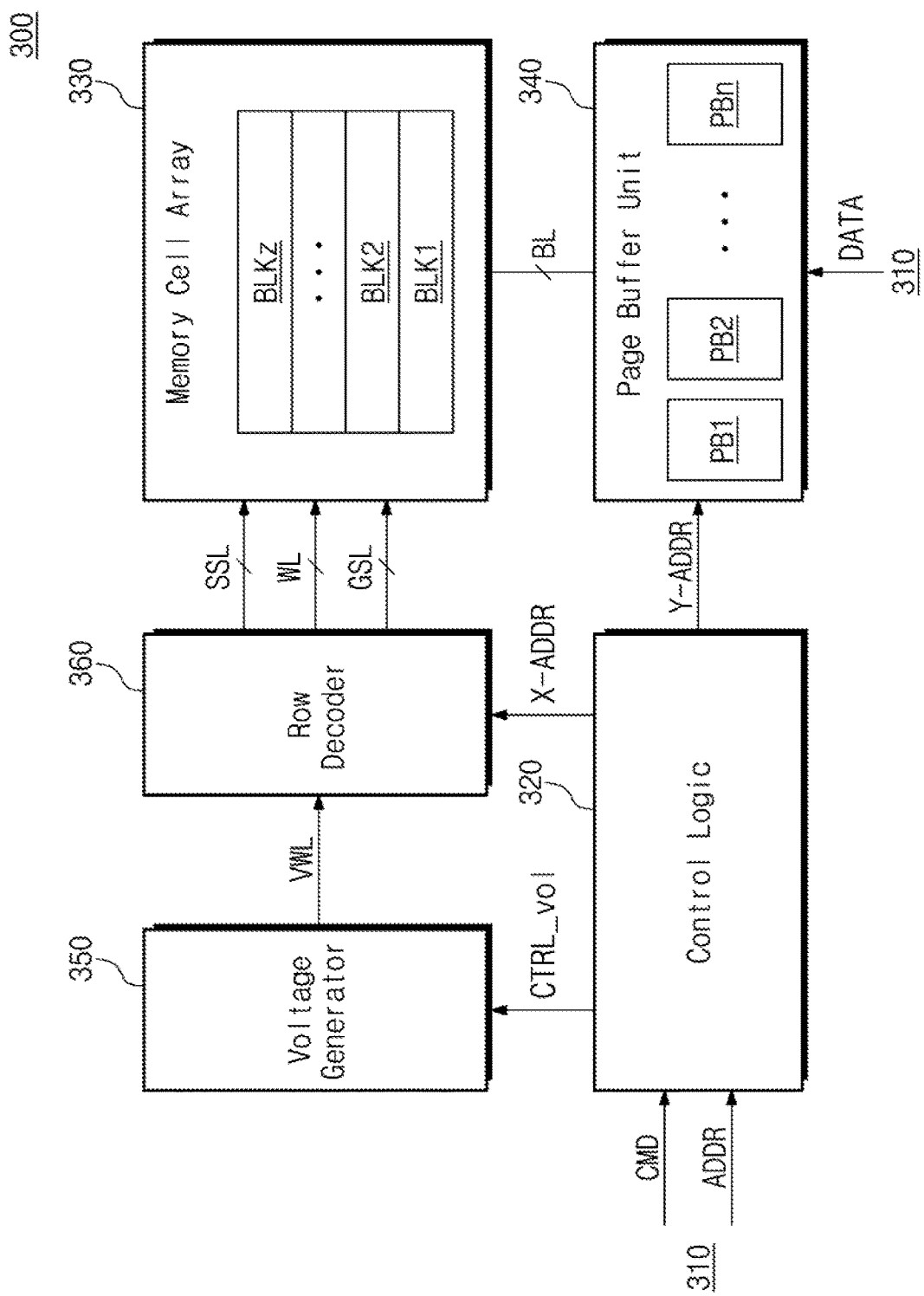
FIG. 11 is a diagram illustrating a memory device according to an embodiment of the inventive concept.

FIG. 11 is an embodiment of a memory device 300. Referring to FIG. 11, the memory device 300 may include a control logic circuit 320, a memory cell array 330, a page buffer unit (circuitry) 340, a voltage generator 350, and a row decoder 360. The memory device 300 may further include a pre-decoder, a temperature sensor, a command decoder, an address decoder, and the like.

The control logic circuit 320 may control various kinds of operations of the memory device 300. The control logic circuit 320 may output various control signals in response to a command CMD and/or an address ADDR from a memory interface circuit 310. For example, the control logic circuit 320 may output a voltage control signal CTRL_vol, a row address X-ADDR, and a column address Y-ADDR.

The memory cell array 330 may include a plurality of memory blocks BLK1 to BLKz (z being an integer), each of which includes a plurality of memory cells. The memory cell array 330 may be connected with the page buffer unit 340 through bit lines BL and may be connected with the row decoder 360 through string selection lines SSL, word lines WL, and ground selection lines GSL.

In an exemplary embodiment, the memory cell array 330 may include a three-dimensional memory cell array, and the three-dimensional memory cell array may include a plurality of NAND strings. Each of the NAND strings may include memory cells respectively connected with memory cells stacked in a direction perpendicular to a substrate, and the following patent documents, which are herein incorporated by reference, describe suitable configurations for three-dimensional memory arrays: U.S. Pat. Nos. 7,679,133; 8,553,466; 8,654,587; 8,559,235; and US Pat. Pub. No. 2011/0233648. Alternatively, the memory cell array 330 may include a two-dimensional memory cell array, which includes a plurality of NAND strings arranged in a row direction and a column direction.

The page buffer unit 340 may include a plurality of page buffers PB1 to PBn (n being an integer of 3 or more), and the plurality of page buffers PB1 to PBn may be respectively connected with memory cells through the bit lines BL. The page buffer unit 340 may select the bit lines BL (or a part of the bit lines BL) in response to the column address Y-ADDR. Depending on an operating mode, the page buffer unit 340 may operate as a write driver or may operate as a sense amplifier that corresponds to the current sense amplifier 180 described above. For example, in a program operation, the page buffer unit 340 may apply a bit line voltage corresponding to data to be programmed to a selected bit line. In a read operation, the page buffer unit 340 may latch data of a memory cell connected with the selected bit line by sensing a current or a voltage of the selected bit line.

The voltage generator 350 may generate various kinds of voltages for performing program, read, and erase operations, based on the voltage control signal CTRL_vol. For example, the voltage generator 350 may generate a program voltage, a read voltage, a program verification voltage, an erase voltage, or the like as a word line voltage VWL.

In response to the row address X-ADDR, the row decoder 360 may select one of the word lines WL and may select one of the string selection lines SSL. For example, the row decoder 360 may apply the program voltage/program verification voltage to the selected word line in the program operation and may apply the read voltage to the selected word line in the read operation.

Figure 12:
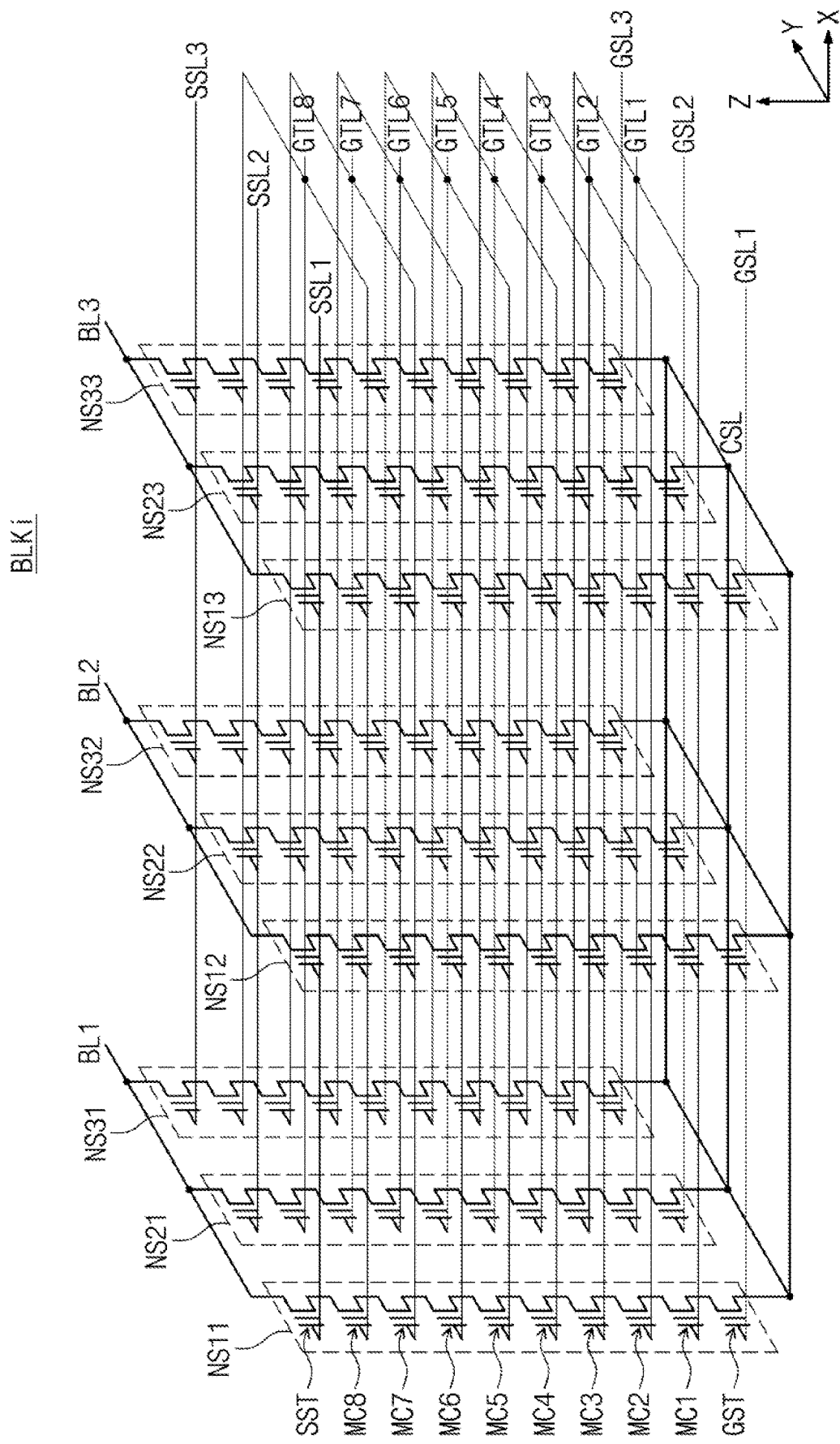
FIG. 12 is a diagram for describing a 3D V-NAND structure applicable to a memory device according to the inventive concept.

FIG. 12 is a diagram for describing a 3D V-NAND structure applicable to the memory device 100 according to the inventive concept. In the case where a storage module of the memory device 100 is implemented with a 3D V-NAND flash memory, each of a plurality of memory blocks constituting the storage module may be expressed by an equivalent circuit illustrated in FIG. 12.

A memory block BLKi illustrated in FIG. 12 indicates a three-dimensional memory block formed on a substrate in a three-dimensional structure. For example, a plurality of NAND strings included in the memory block BLKi may be formed in a direction perpendicular to the substrate.

Referring to FIG. 12, the memory block BLKi may include a plurality of NAND strings NS11 to NS33 connected between bit lines BL1, BL2, and BL3 and a common source line CSL. Each of the plurality of NAND strings NS11 to NS33 may include a string selection transistor SST, a plurality of memory cells MC1 to MC8, and a ground selection transistor GST. An embodiment is illustrated in FIG. 12 as each of the plurality of NAND strings NS11 to NS33 includes 8 memory cells MC1 to MC8, but the inventive concept is not limited thereto.

The string selection transistors SST of the NAND strings NS11 to NS33 may be connected with string selection lines SSL1, SSL2, and SSL3. The memory cells MC1 to MC8 of the NAND strings NS11 to NS33 may be connected with gate lines GTL1 to GTL8. The gate lines GTL1 to GTL8 may be used as word lines. For example, a part of the gate lines GTL1 to GTL8 may be used as a dummy word line(s). The ground selection transistors GST of the NAND strings NS11 to NS33 may be connected with ground selection lines GSL1, GSL2, and GSL3. The string selection transistors SST of the NAND strings NS11 to NS33 may be connected with the bit lines BL1, BL2, and BL3, and the ground selection transistors GST of the NAND strings NS11 to NS33 may be connected with the common source line CSL.

Gate lines (e.g., GTL1) of the same height may be connected in common (or memory cells of the same height may be connected with a common gate line (or word line)), the ground selection lines GSL1 to GSL3 may be separated from each other, and the string selection lines SSL1 to SSL3 may be separated from each other. An embodiment is illustrated in FIG. 12 as the memory block BLKi includes (or is connected with) 8 gate lines GTL1 to GTL8 and 3 bit lines BL1 to BL3, but the inventive concept is not limited thereto.

The disclosed embodiments can be implemented using a non-transitory recording medium storing instructions executable by a computer. The instructions can be stored in the form of a program code, and may generate, when executed by a processor, a program module such that the operations of the disclosed embodiments can be performed. The recording medium can be implemented as a computer-readable recording medium.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory device comprising:
a memory cell;
a bit line connected to the memory cell;
a controller configured to generate at least one current control code;
a first current generator configured to generate a first current having a proportional to absolute temperature (PTAT) characteristic, based on the at least one current control code from the controller;
a second current generator configured to generate a second current having a complementary to absolute temperature (CTAT) characteristic, based on the at least one current control code from the controller;
a subtractor configured to generate a third current by subtracting the second current from the first current; and
a sense amplifier configured to control, based on the third current, a load current to be supplied to the bit line, and to generate a bit line compensation current for compensating for a leakage current of the bit line.

2. The memory device of claim 1, further comprising:
a pulse signal generator configured to output a pre-charge pulse signal to the sense amplifier,
wherein the pulse signal generator generates the pre-charge pulse signal based on a magnitude of the third current under control of the controller.

3. The memory device of claim 2, wherein the at least one current control code causes the magnitude of the third current to increase and a pulse width of the pre-charge pulse signal to increase as temperature of the memory device increases.

4. The memory device of claim 2, wherein the second current is generated based on an increment of the first current.

5. The memory device of claim 2, wherein the at least one current control code causes the magnitude of the third current to decrease and a pulse width of the pre-charge pulse signal to decrease as temperature of the memory device decreases.

6. The memory device of claim 5, wherein the second current is generated based on a decrement of the first current.

7. The memory device of claim 1, wherein the at least one current control code controls a slope of the third current as a function of temperature of the memory device.

8. The memory device of claim 1, wherein the second current generator performs a current mirror operation.

9. The memory device of claim 1, wherein the memory cell includes one of a dynamic random access memory (DRAM) cell, a static random access memory (SRAM) cell, and a NAND flash memory cell.

10. A control method of a memory device, the method comprising:
generating at least one current control code; and
controlling the memory device using the at least one current control code,
wherein the controlling of the memory device includes:
generating a first current having a proportional to absolute temperature (PTAT) characteristic based on the at least one current control code,
generating a second current having a complementary to absolute temperature (CTAT) characteristic based on the at least one current control code,
generating a third current by subtracting the second current from the first current,
controlling a load current to be supplied to a bit line based on the third current, and
generating a bit line compensation current for compensating for leakage current of the bit line.

11. The method of claim 10, further comprising:
generating a pre-charge pulse signal to be provided to a sense amplifier,
wherein the controlling of the memory device further includes:
controlling a pulse signal generator which generates the pre-charge pulse signal based on a magnitude of the third current.

12. The method of claim 11, wherein the controlling of the memory device further includes:
causing, based on the at least one current control code, the magnitude of the third current to increase and a pulse width of the pre-charge pulse signal to increase when temperature of the memory device increases.

13. The method of claim 11, wherein the controlling the memory device further includes:
   generating, according to the at least one current control code, the second current based on an increment of the first current.

14. The method of claim 11, wherein the controlling of the memory device further includes:
   generating the current control code such that the magnitude of the third current decreases and a pulse width of the pre-charge pulse signal decreases when temperature of the memory device decreases.

15. The method of claim 14, wherein the controlling the memory device further includes:
   generating the current control code such that the second current is generated based on a decrement of the first current.

16. The method of claim 10, wherein the controlling the memory device further includes:
   generating the current control code such that a slope of the third current is controlled according to temperature of the memory device.

17. The method of claim 11, wherein the second current is generated by a current mirror operation.

18. The method of claim 11, wherein the controlling of the memory device further includes:
   controlling one of a dynamic random access memory (DRAM) cell, a static random access memory (SRAM) cell, and a NAND flash memory cell.

19. A memory device comprising:
   a memory cell;
   a bit line connected to the memory cell;
   a first current generator configured to generate a first current having a proportional to absolute temperature (PTAT) characteristic;
   a second current generator configured to generate a second current having a complementary to absolute temperature (CTAT) characteristic;
   a subtractor configured to generate a third current by subtracting the second current from the first current; and
   a sense amplifier configured to control, based on the third current, a load current to be supplied to the bit line, and generate a bit line compensation current for compensating for a leakage current of the bit line.

20. The memory device of claim 19, wherein the third current has a slope as a function of temperature that is higher than that of the first current.

* * * * *